(12) United States Patent
Sato

(10) Patent No.: US 6,803,312 B2
(45) Date of Patent: Oct. 12, 2004

(54) SEMICONDUCTOR DEVICE AND METHOD FOR FABRICATING THE SAME

(75) Inventor: Yutaka Sato, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/285,520

(22) Filed: Nov. 1, 2002

(65) Prior Publication Data

US 2003/0139036 A1 Jul. 24, 2003

(30) Foreign Application Priority Data

Jan. 21, 2002 (JP) ........................................ 2002-012062

(51) Int. Cl.$^7$ ................................................. H01L 21/44
(52) U.S. Cl. ....................... 438/678; 438/669; 438/671; 438/597; 438/674
(58) Field of Search ................................. 438/678, 669, 438/671, 597, 625, 618, 666, 667, 674

(56) References Cited

U.S. PATENT DOCUMENTS

| | | | | |
|---|---|---|---|---|
| 4,980,034 A | * | 12/1990 | Volfson et al. | ............. 205/122 |
| 5,266,519 A | * | 11/1993 | Iwamoto | ...................... 438/625 |
| 5,340,773 A | * | 8/1994 | Yamamoto | .................. 438/653 |
| 5,639,686 A | * | 6/1997 | Hirano et al. | ................ 438/381 |
| 6,350,633 B1 | * | 2/2002 | Lin | ............................. 438/113 |
| 6,562,657 B1 | * | 5/2003 | Lin | ............................. 438/113 |
| 6,562,709 B1 | * | 5/2003 | Lin | ............................. 438/618 |
| 6,593,220 B1 | * | 7/2003 | Yu et al. | ...................... 438/612 |
| 6,630,387 B2 | * | 10/2003 | Horii | ........................... 438/396 |
| 6,642,080 B1 | * | 11/2003 | Ference et al. | ............. 348/109 |

FOREIGN PATENT DOCUMENTS

JP      10-64953      3/1998

* cited by examiner

*Primary Examiner*—Matthew Smith
*Assistant Examiner*—B. V. Keshavan
(74) *Attorney, Agent, or Firm*—Armstrong, Kratz, Quintos, Hanson & Brooks, LLP (57) ABSTRACT

A method for fabricating a semiconductor device includes the steps of forming a mask on a predetermined layer, said mask having a first opening at a given side of the predetermined layer and a second opening that continues to and is smaller than the first opening, and forming a plating layer on the predetermined layer by using the mask.

21 Claims, 8 Drawing Sheets

SEMICONDUCTOR DEVICE AND METHOD FOR FABRICATING THE SAME

CROSS-REFERENCE TO RELATED APPLICATIONS

This application is based on, and claims priority to, Japanese application number 2002-012062, filed on Jan. 21, 2002, in Japan, and which is incorporated herein by reference.

BACKGROUND OF THE INVENTION

Field of the Invention

The present invention generally relates to semiconductor integrated circuit devices and method for fabricating those devices. More particularly, the present invention relates to a semiconductor device that employs interconnections, wiring lines and electrodes formed by plating, and a method for fabricating the same. Conventionally, various methods for forming wiring lines and electrodes are used. Among these methods, a plating method is widely used as a useful method for forming thin films.

Figure 1:
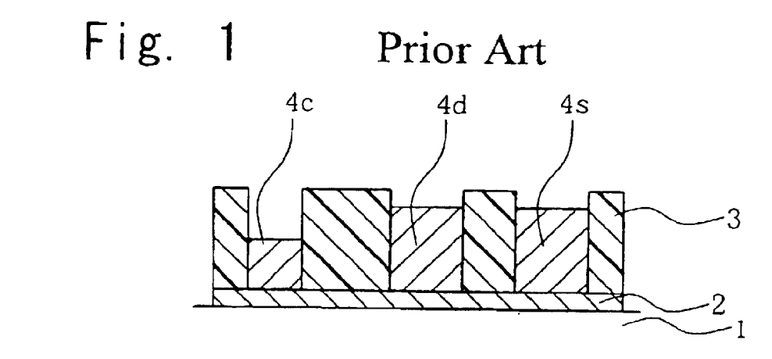
FIG. 1 is a view of a conventional plating process.

Japanese Unexamined Patent Publication No. 10-64953 discloses a method for fabricating a wiring line and electrode by means of plating. The method described in the above publication is now described with reference to FIG. 1. A pilot metal layer 2 is formed on an insulating substrate 1, and pillars are then formed by plate growth in such a way as to use a photoresist layer 3 as a mask. The mask 3 has a plurality of openings having different sizes. The pillars are formed in plating liquid, and different amounts of fresh plating liquid are supplied to different sizes of openings. In other words, plating or growth progresses at different rates in different sizes of openings in the mask 3. The difference in plating or growth rate forms a thin plating layer (pillar) 4c in an opening having a relative small size, and a thick plating layer 4d in an opening having a relative large size. Thus, an opening having a relatively large size is formed in a position on the mask 3 in which a relatively thick plating layer is to be formed, while an opening having a relatively small size is formed in a position in which a relatively thin plating layer is to be formed.

As described above, the rate of supply of plating liquid depends on the area of the opening, so that the thickness (height) of the growth of plating is proportional to the supply of plating liquid. When plating is simultaneously applied to opening having different areas, a relatively thin plating layer is formed in an opening of a relatively small area, while a relatively thick plating layer is formed in an opening of a relatively large area. Therefore, it is impossible to simultaneously form a relatively thick plating layer in an opening having a relatively small area and a relatively thin plating layer in an opening having a relatively large area. It is also impossible to simultaneously form plating layers having different thicknesses in openings having an identical area.

Therefore, only plating interconnections that depend on the respective opening sizes can be formed on the same layer. In order to obtain plating layers that have different sizes but have the same height, the plate growth must be separately carried out for each of the different opening sizes. When the electrodes are formed by plating, these electrodes are grown to respective thicknesses depending on the opening sizes. This may cause bonding failure.

SUMMARY OF THE INVENTION

Accordingly, it is an object of the present invention to provide a method for fabricating a semiconductor device capable of controlling the plate growth rate and a semiconductor device fabricated by the method.

Additional objects and advantages of the present invention will be set forth in part in the description which follows, and, in part, will be obvious from the description, or may be learned by practice of the invention.

The foregoing objects of the present invention are achieved by providing a method for fabricating a semiconductor device including the steps of:

(a) forming a mask on a predetermined layer, said mask having a first opening at a given side of the predetermined layer and a second opening that continues to and is smaller than the first opening; and (b) forming a plating layer on the predetermined layer by using the mask.

The objects of the present invention are also achieved by a method for fabricating a semiconductor device including the steps of:

(a) forming a mask on a predetermined layer, said mask having an opening;

(b) forming an overhang that covers part of the opening; and (c) forming plating layers on the predetermined layer by using the mask, a growth rate of one of the plating layers formed in said opening partially covered by said overhang being equal to that of another one of the plating layers formed in another opening.

The objects of the present invention are also achieved by a semiconductor device including plating layers formed on a predetermined layer, the plating layers having different widths, an identical height, and an identical hardness.

The objects of the present invention are also achieved by a semiconductor device including plating layers formed on a predetermined layer, one of the plating layers having a first portion that vertically extends with a constant width, and a second portion that continues to the first portion and is wider than the first portion.

BRIEF DESCRIPTION OF THE DRAWINGS

Reference will now be made in detail to the preferred embodiments of the present invention, examples of which are illustrated in the accompanying drawings, in which.

DESCRIPTION OF THE PREFERRED EMBODIMENTS

First, a description will be given of the principles of the present invention.

Figure 2:
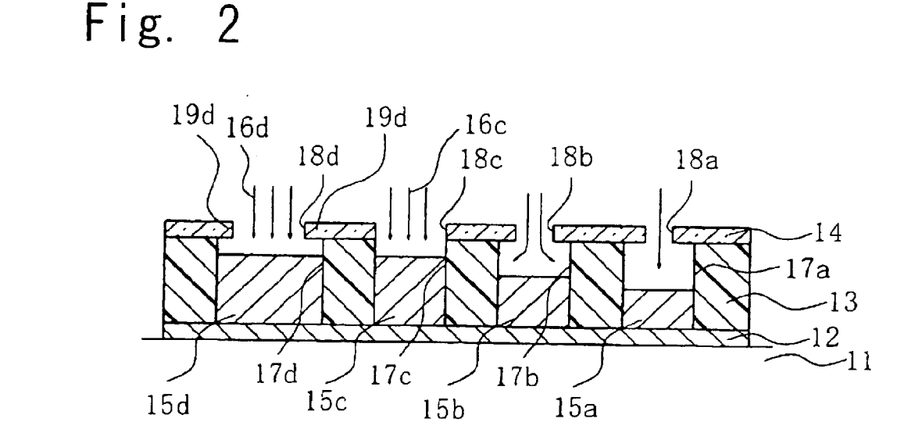
FIG. 2 is a view describing the principles of the present invention.

Referring to FIG. 2, a patterned plating mask 13 that serves as a first mask layer is formed on an power feed metal 12 (electrically conductive layer) formed on a semiconductor substrate 11. The plating mask 13 has openings 17a–17d that serve as first openings. A patterned plating mask 14 that serves as a second mask layer is formed on the plating mask 13. The plating mask 14 has openings 18a–18d that serve as second openings. Plating layers 15a–15d are formed by performing a plating process only one time. Openings 17a–17d and openings 18a–18d are those of the whole mask consisting of the plating mask 13 and the plating mask 14.

The openings 17a–17d respectively continue to the openings 18a–18d. The openings 18a, 18b and 18d other than the opening 18c are formed so as to restrict the first openings 17a, 17b and 17d, respectively. In other words, the areas (sizes) of the openings 18a, 18b and 18d are narrower (smaller) than those of the openings 17a, 17b and 17d, respectively. If the openings have an identical length in the direction perpendicular to the drawing sheet, it can be said that the openings 18a, 18b and 18d have the respective traverse lengths (widths) smaller than those of the openings 17a, 17b and 17d, respectively. The opening 18c has the same size as the opening 17c. In other words, the opening 18c has the same width as the opening 17c. The plating mask 14 has overhang portions that restrict the first openings. For example, overhang portions 19d are formed so as to restrict the opening 17d. The overhang portions 19d are parts of the plating mask 14. From that point of view, the plating mask 14 is an overhang mask. For the sake of simplicity, reference numerals that are to be assigned to overhang portions associated with the other openings 18a–18c are omitted.

The areas of the second openings 18a–18d formed in the plating mask 14 determine the growth rate of the plating layers 15a–15d in the first openings 17a–17d. For instance, the rate of growth of the plating layer 15d does not depend on the area of the first opening 17d but that of the second opening 18d. If the openings 18c and 18d have an identical area (identical width in case where these openings have an identical length), the plating layers 15c and 15d are grown at an identical rate. In other words, the amount of plating liquid 16c is equal to that of plating liquid 16d. Thus, the plating layers 15c and 15d have different sizes (widths), nevertheless they have an identical height. It is to be noted that the foregoing conventional art cannot grow plating layers of different sizes to an identical height (thickness) by only once plating.

As described above, it is possible to arbitrary control the height (thickness) of the plating layer 15d irrespective of the surface area of the plating layer 15d, in other words, the area of the first opening 17d.

In case where the plating layers 15a and 15b have an identical area (an identical width for the same length in the direction perpendicular to the drawing sheet), it is possible to realize different heights of the plating layers 15a and 15b by changing the areas of the openings 18a and 18b (by changing the widths for the same length in the direction perpendicular to the drawing sheet) although the plating layers 15a and 15b have the same area. The foregoing conventional art cannot realize the different heights for the identical area by performing the plating process only one time.

As described above, one aspect of the present invention, the semiconductor device shown in FIG. 2 can be fabricated by the method including the first step of forming a mask (composed of the masks 13 and 14) on a predetermined layer (the power feed metal 12) wherein the mask has the first openings 17a–17d located at the side of the predetermined layer (the power feed metal 12) and the second openings 18a–18d that continue to the first openings 17a–17d and are respectively equal to or smaller than the first openings 17a–17d, and the second step of forming the plating layers 15a–15d on the predetermined layer by using the mask.

The plating layers 15a–15d may be interconnections, wiring lines, or electrodes that can be formed by plating. The electrodes may be parts to which conductors such as wires are to be connected and other electrically conductive layers such as bumps, lead electrodes and spacers.

Figure 3:
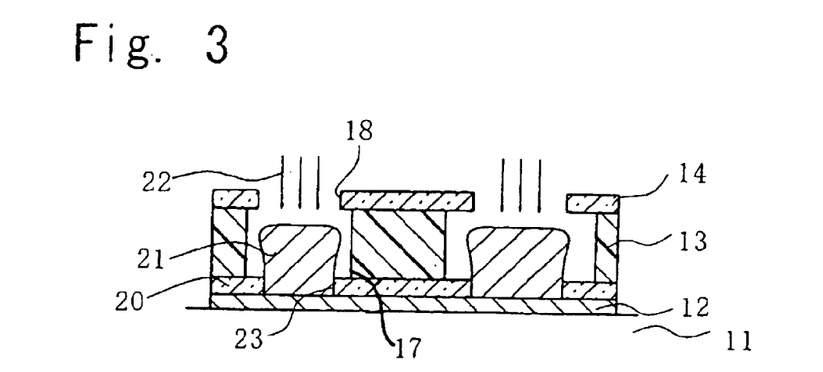
FIG. 3 is a view of a plating process to which the principles of the present invention are applied.

FIG. 3 shows a process of forming a plating layer with its upper portion being chamfered by means of a third plating mask, which is additionally used to the fabricating method shown in FIG. 2. In FIG. 3, identical or like reference numerals refer to identical or like elements throughout.

Referring to FIG. 3, a third plating mask 20 is used in addition to the first plating mask 13 and the second plating mask 14. The third plating mask 20 is formed on the power feed metal 12, and has a plurality of openings 23. In FIG. 3, a reference numeral 23 is assigned to only one of the openings for the sake of simplicity. The openings 23 are the third openings and are continuous to the first openings 17. The areas (sizes) of the third openings 23 are smaller than those of the first openings 17. In the example of FIG. 3, the widths of the third openings 23 are narrower than those of the first openings 17.

When plating is performed with power supplied to the feed metal 12, plating liquid 22 passes through the second openings 18 and enters into the first openings 17 and the third openings 23. At the commencement of plating, the widths of plating layers 21 are defined by the widths of the third openings 23, so that plate growth stands vertically from the third openings 23. That is, the plating layer 21 is grown so as to have an even width. The initially rising portions of the plating layers 21 are substantially vertical to the feed metal 12. During the initial growth, the plating layers 21 do not contact the first plating mask 13. The third openings 23 formed in the third plating mask 20 function to define a gap (space) between the growing plating layers 21 and the plating mask 13. Thereafter, the plating layers 21 grow while the traverse sizes thereof are continuously increasing so that the plating layers 21 become wider gradually. Then, the widths of the plating layers 21 become smaller gradually. As a result of the above growth, the plating layers 21 have protrusions on the side surfaces thereof, and have chamfered upper corner portions. It can be said that the plating mask 20 serve as a chamber definition mask.

By the above-mentioned method, it is possible to realize the chamfered plating layers having a desired height (thickness) by performing plating only once.

The plating layers shown in FIGS. 2 and 3 that have the same height but the different widths can be realized by once plating. The plating layers thus formed, for example, the plating layers 15c and 15d in FIG. 2, have an identical hardness. The hardness of the plating layer depends on the rate of growth thereof. In the example of FIG. 2, the plating layers 15c and 15d grow at the same rate and therefore have the same hardness. If it is attempted to form the plating layers 15c and 15d by the conventional art, the plating process must be performed twice at different rates of growth. The plating layers 15c and 15d thus formed have different degrees of hardness. The hardness of the chamfered plating layer can be measured by a method that will be described later.

First Embodiment

A description will now be given of a first embodiment of the present invention. In the following, a method of fabricating a semiconductor device that has an interconnection or wiring line shown in FIG. 4 is described by way of example.

Figure 4:
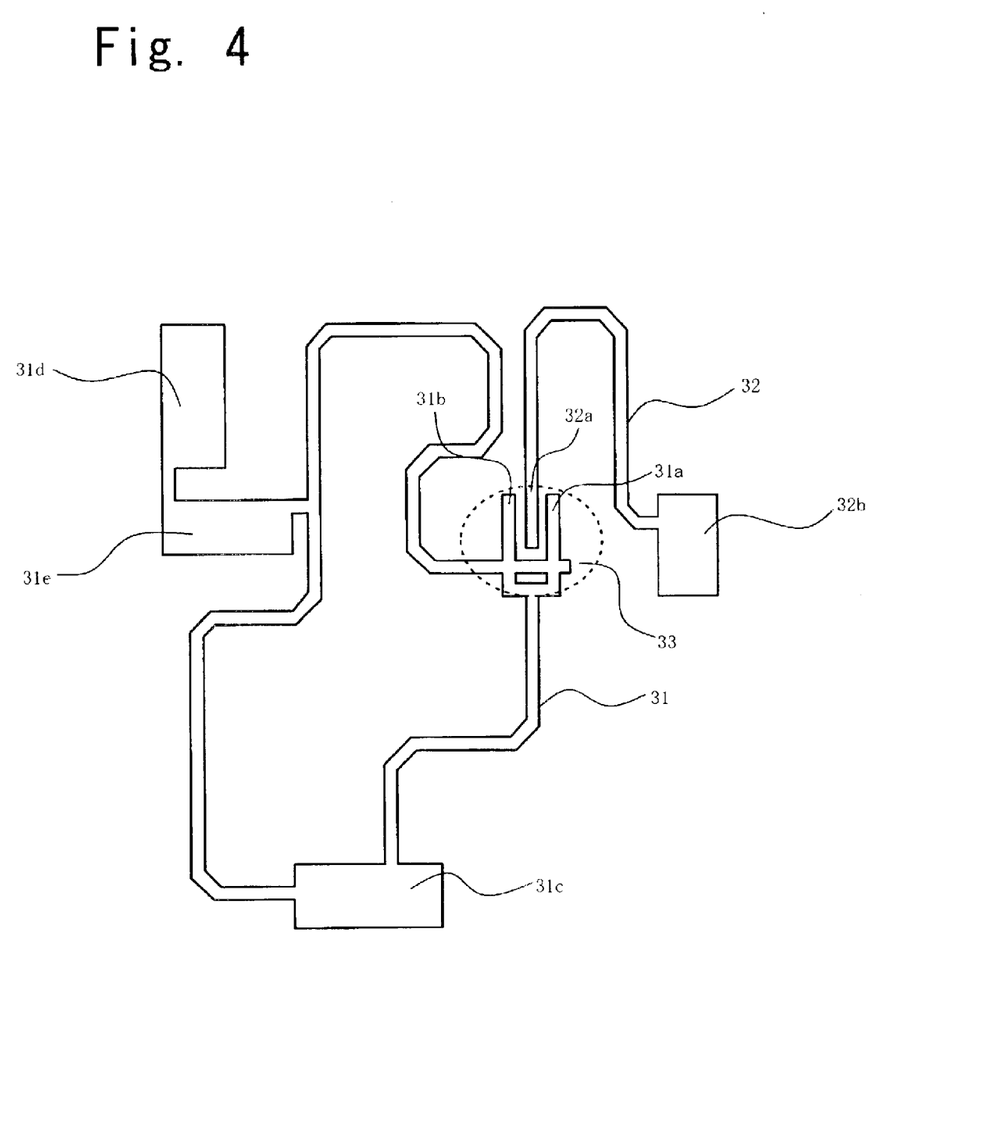
FIG. 4 is a plan view of a wiring pattern formed by plating.

FIG. 4 shows an example of wiring lines formed by plating. In FIG. 4, a wiring line 31 and a wiring line 32 are illustrated. The opening area of the wiring line 31 is relatively wide and needs a plating mask that has a relatively wide opening area. In contrast, the wiring line 32 is shorter than the wiring line 31, and has an opening area narrower than that of the wiring lien 31. The wiring line 31 includes a portion 31a connected to the drain (or source) of a transistor 33, a portion 31b connected to the source (or drain) thereof, electrodes 31c and 31d, and an electrode 31e that is one of the two gates of a capacitor.

The present invention is needed to form the wiring lines shown in FIG. 4 for the following reasons and brings about the following advantages. In order to facilitate understanding the invention, a description will now be given of problems that may arise from the conventional art applied to formation of the wiring lines shown in FIG. 4.

Figure 5:
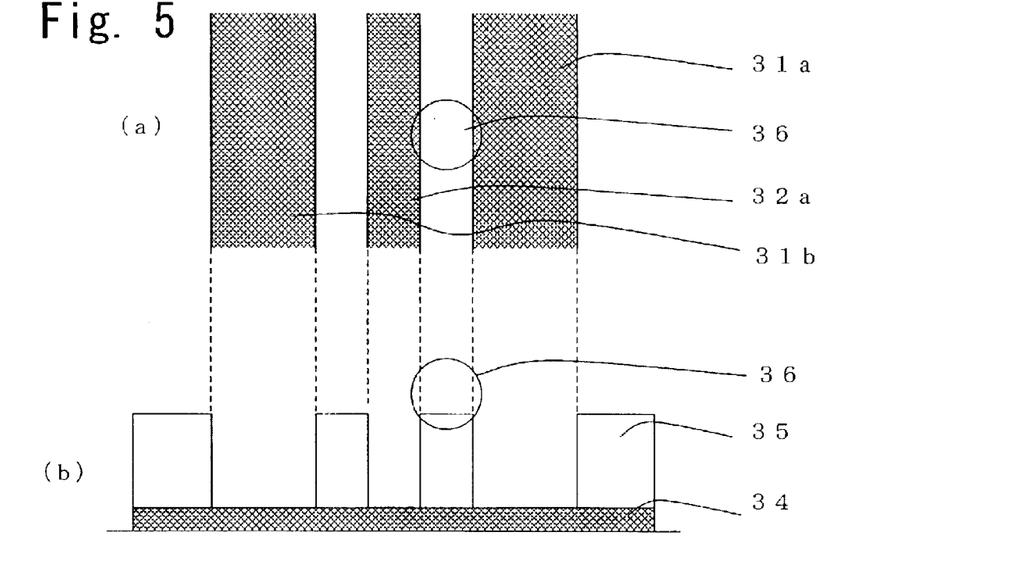
FIG. 5 shows a transistor part shown in FIG. 4, wherein part (a) of FIG. 5 is a plan view portion of the transistor part, and part (b) shows a plating mask used for forming the pattern shown in part (a) by conventional art.

Part (a) of FIG. 5 is an enlarged plan view of the wiring lines located in an oval 33 shown in FIG. 4, and part (b) thereof shows plating mask employed in the conventional art. Plating mask 35 is formed on a power feed metal 34. Plating is performed by placing the electrode 34 with the mask 35 formed thereon in a plating chamber. A relatively large amount of plating liquid is supplied to relatively wide openings for the wiring lines 31, whereby the plating layers grow at a relatively high rate. In contrast, a relatively small amount of plating liquid is supplied to a relatively narrow opening for the wiring line 32, whereby the plating layer grows at a relatively low rate. Therefore, plating is required to be continuously performed until the plating layer of the wiring line 32 formed via the narrow opening grows to the desired thickness. However, the wiring lines 31 are over-plating layers.

Figure 6:
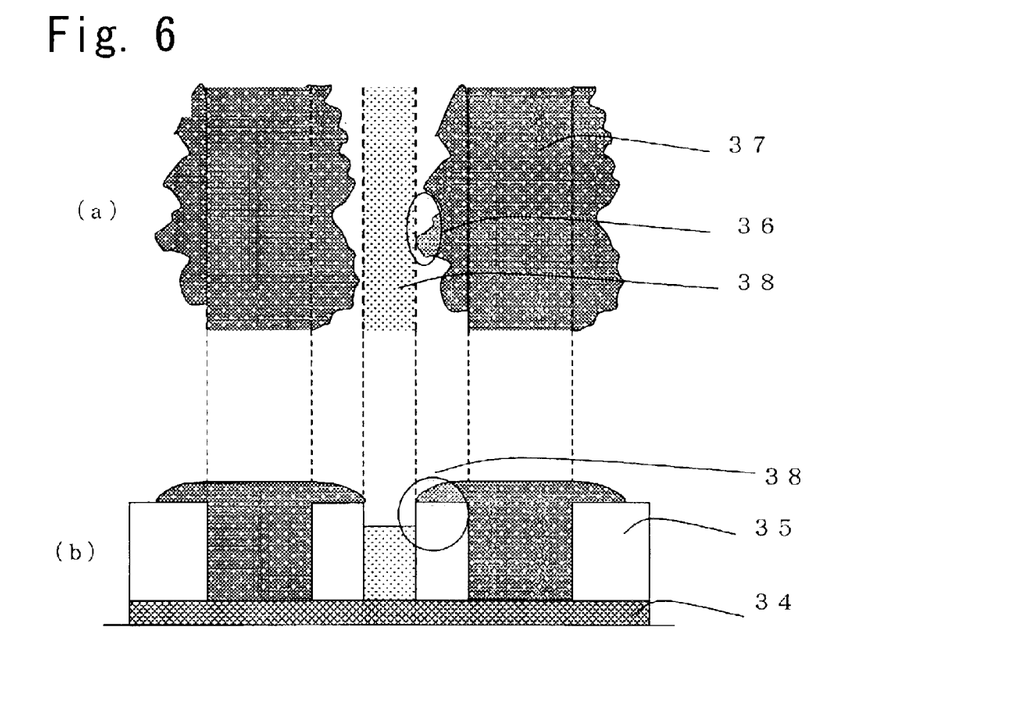
FIG. 6 shows a problem that arises from the conventional art.
Figure 7:
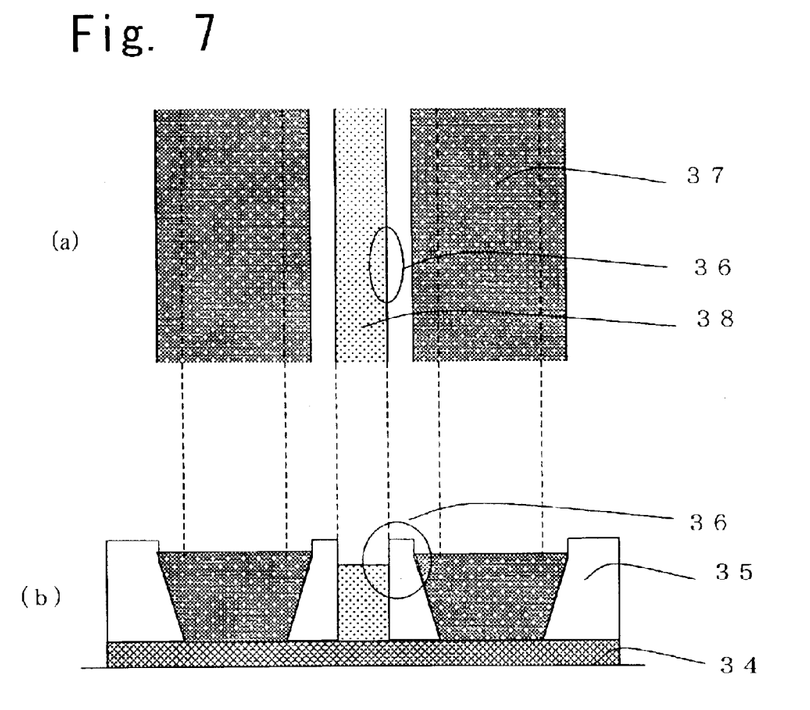
FIG. 7 shows another problem that arises from the conventional part.
Figure 8:
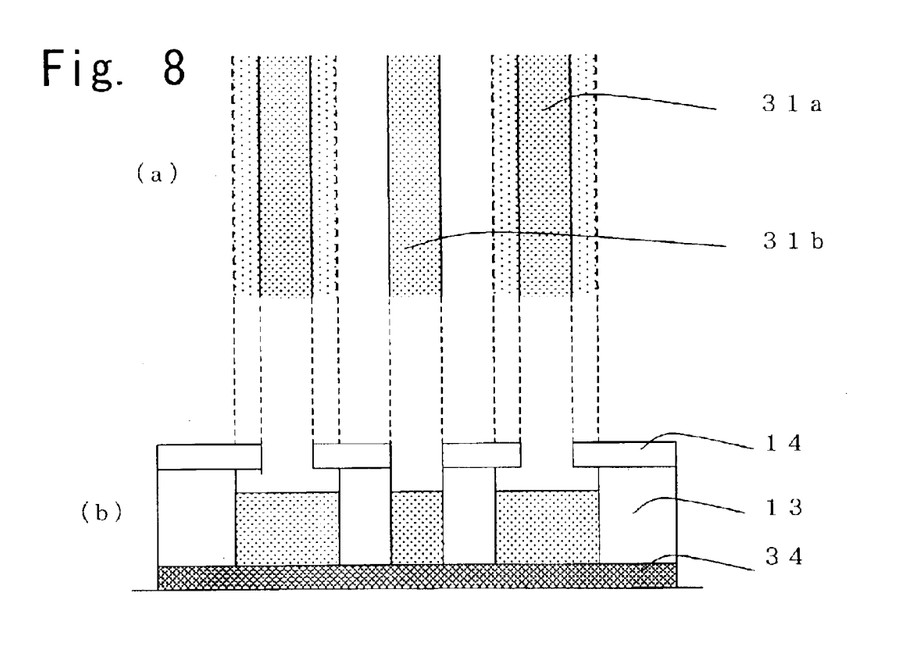
FIG. 8 shows a transistor part shown in FIG. 4, wherein part (a) of FIG. 8 is a plan view portion of the transistor part, and part (b) shows a plating mask used for forming the pattern shown in part (a) by the present invention.

The above problem is illustrated in FIG. 6. An area 36 in which the wiring line 31a and the wiring line 32a are close to each other is affected by over-plating. A plating layer 37 excessively grows so as to extend over the plating mask 35 and contact an adjacent plating layer 38, so that the plating layers 37 and 38 are short-circuited. Further, the over-plating layer 37 may deform the plating mask 35, as shown in FIG. 7. The deformation of the plating mask 35 reduces the space between the wiring lines 31a and 32a. The reduction in the separating space may increase the capacitance between the wiring lines 31a and 32a and may degrade the performance. In order to avoid the above-mentioned problems, plate growth that does not depend on the opening area is needed. Such plate growth is provided by the present invention that has the principles described with reference to FIGS. 2 and 3. In contrast, according to the present invention, the wiring lines 31a and 31b are formed as shown in part (a) of FIG. 8 by using the plating masks 13 and 14 shown in part (b) of FIG. 8. The masks 13 and 14 have been described with reference to FIGS. 2 and 3.

A description will now be given of a method for fabricating the semiconductor device according to the first embodiment of the present invention with reference to FIGS. 9A through 9G. In these figures, parts that are the same as those shown in the previously described drawings are given the same reference numerals.

Figure 9A:
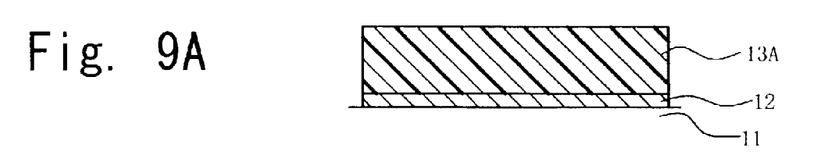
FIGS. 9A through 9G are views of steps of the method for fabricating a semiconductor device according to a first embodiment of the present invention.
Figure 9B:
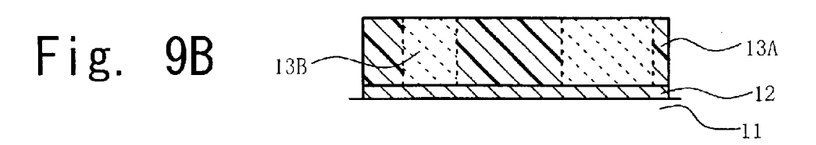
Figure 9C:
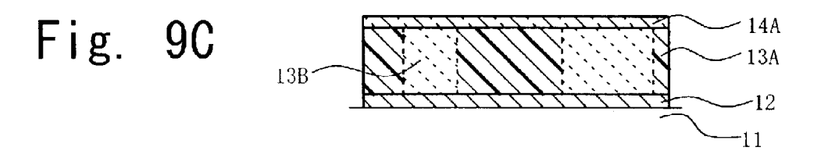
Figure 9D:
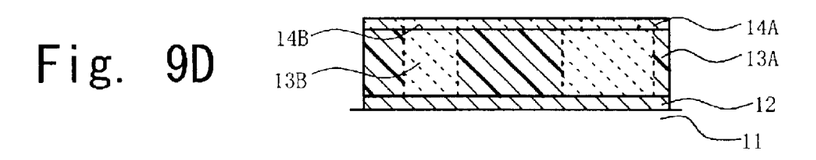
Figure 9E:
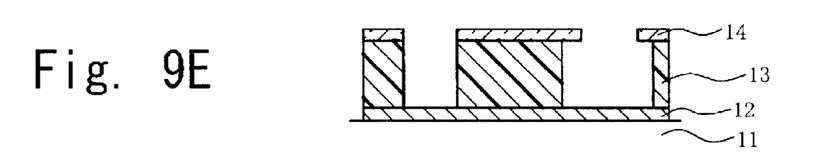

First, as shown in FIG. 9A, the gold-based power feed metal 12 is grown onto the semiconductor substrate 11, and a resist 13A for forming the plating mask 13 is coated on the metal 12. Next, as shown in FIG. 9B, plating growing areas 13B of the resist 13A are exposed. At this time, the resist 13A is not developed. Then, as shown in FIG. 9C, the resist 13A is coated with a mixing resistance agent, and is then coated with a resist 14A for forming the overhang mask 14. Thereafter, as shown in FIG. 9D, overhang formation areas of the resist 14A are exposed. Then, the resists 13A and 14A are developed, as shown in FIG. 9E. The development results in the plating mask 13 and the overhang mask 14.

Figure 9F:
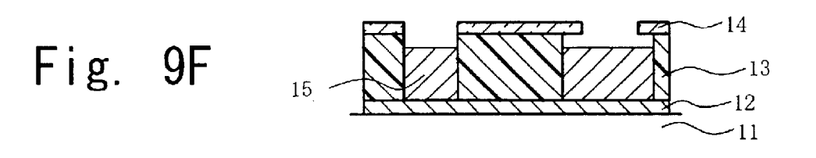
Figure 9G:
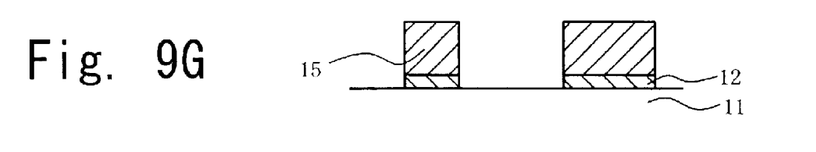

Then, the semiconductor substrate 11 is put in the plating chamber to grow the gold plating layers 15, as shown in FIG. 9F. The plating may be performed using a non-cyan-based gold plating liquid at a cathode current density of 0.4 A/dm² and an operating temperature of 65° C. Then, as shown in FIG. 9G, the plating mask 13 and the overhang mask 14 are removed, and the gold-based feed metal 12 is etched so that the gold plating layers 15 are used as mask.

Accordingly, the wiring plating layers of the same thickness can be formed irrespective of the opening areas of the plating mask 13.

Second Embodiment

Figure 10A:
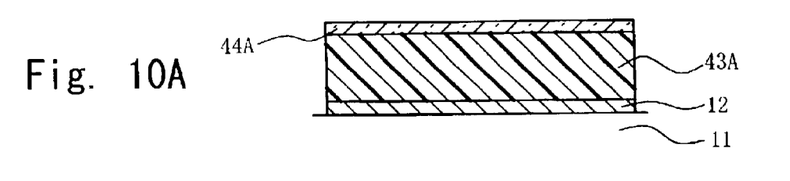
FIGS. 10A through 10G are views of steps of the method for fabricating a semiconductor device according to a second embodiment of the present invention.

A description will now be given of a second embodiment of the present invention with reference to FIGS. 10A through 10G, which parts that are the same as those shown in the previously described figures are given the same reference numerals. As shown in FIG. 10A, the power feed metal 12 is grown on the semiconductor substrate 11, and is thereafter coated with a polyimide layer 43A, which is then cured. Then, an etching mask 44A, which may be made of silicon nitride ($Si_3N_4$), is formed on the polyimide layer 43A. The layers 43A and 44A are made of different insulating substances, which are respectively polyimide and silicon nitride in the embodiment being concerned and has different etching sensitivities. Thus, the layers 43A and 44A can be etched without interference.

Figure 10B:
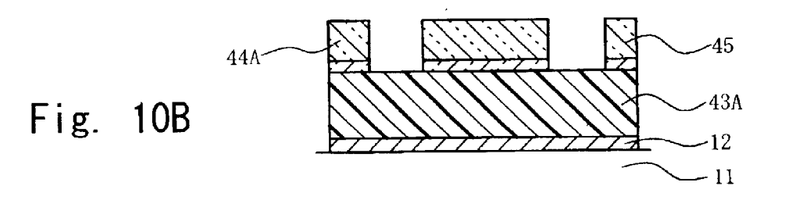
Figure 10C:
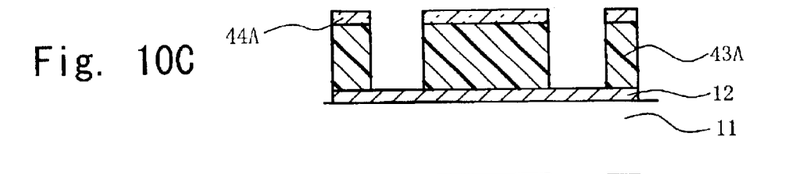
Figure 10D:
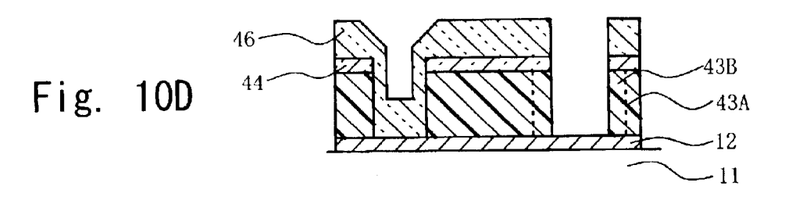
Figure 10E:
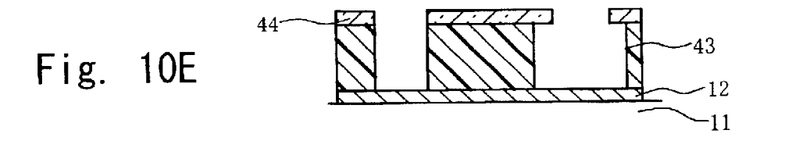
Figure 10F:
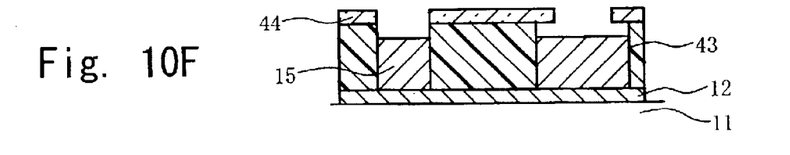
Figure 10G:
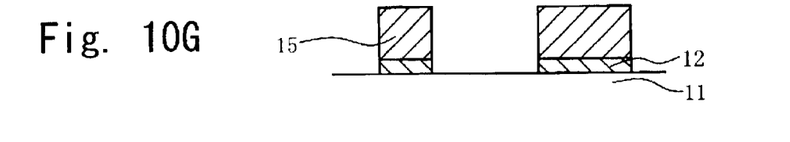

Next, as shown in FIG. 10B, a silicon nitride etching mask 45 is formed by resist deposition and development, and is then etched. Then, as shown in FIG. 10C, the etching mask 45 is removed, and the polyimide layer 43A is etched with the patterned mask 44A used as mask. Thereafter, as shown in FIG. 10D, resist for forming the overhangs is deposited so as to cover the portions of the plating mask 43A in which the overhangs are not to be formed. Then, the resist is exposed and developed. The plating mask 43A is etched so that a side-etched portion 43B is formed in the plating mask 43A, and the mask 46 is removed, as shown in FIG. 10E. This results in a plating mask 43 and an overhang mask 44. As shown in FIG. 10F, the semiconductor substrate 11 is put in the plating chamber and the wiring lines 15 by plating are grown. Finally, as shown in FIG. 10G, the overhang mask 44 and the plating mask 43 are removed by etching.

According to the above-mentioned second embodiment of the present invention with the silicon nitride film 44 used as the overhang mask, it is possible to form the wiring lines of the same thickness (height) by plating irrespective of the opening areas of the plating mask.

Third Embodiment

A description will now be given of a third embodiment of the present invention with reference to FIGS. 11A through 11G, in which parts that are the same as those shown in the previously described figures are given the same reference numerals. The third embodiment of the present invention employs the principles shown in FIG. 3.

Figure 11A:
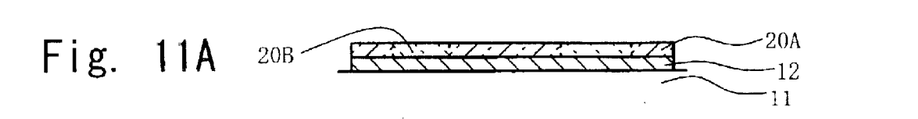
FIGS. 11A through 11G are views of steps of the method for fabricating a semiconductor device according to a third embodiment of the present invention.
Figure 11B:
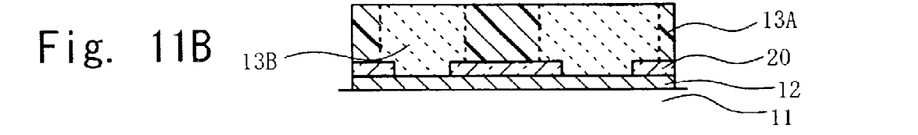
Figure 11C:
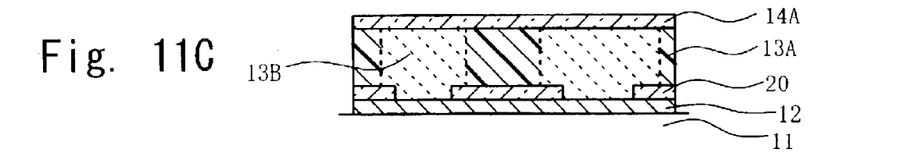
Figure 11D:
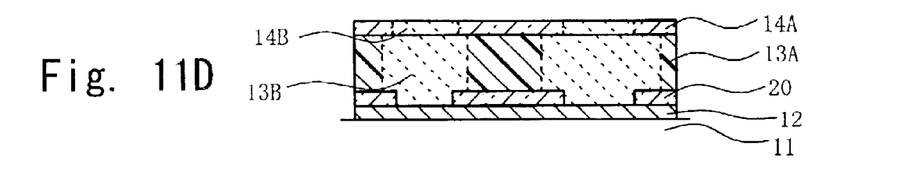
Figure 11E:
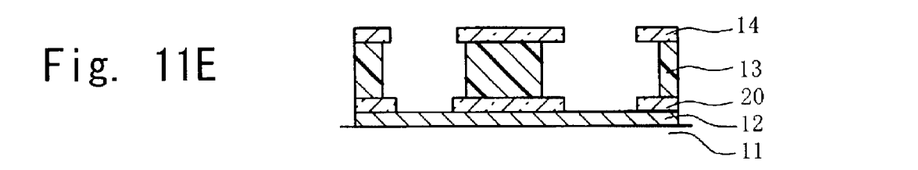
Figure 11F:
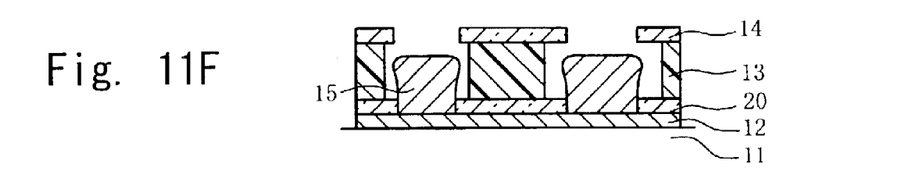
Figure 11G:
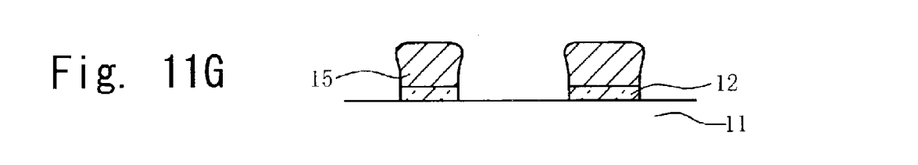

First, as shown in FIG. 11A, the power feed metal 12 is grown on the semiconductor substrate 11. Next, the metal 12 is coated with a chamfer definition resist 20A, which is formed into the chamfer definition mask 20 by exposing and developing plating areas 20B. Then, as shown in FIG. 11B, the resist 13A is deposited and a mask definition area 13B is exposed so as to be wider than the openings formed in the chamfer definition mask 20. At that time, the resist 13A is not developed. Then, as shown in FIG. 11C, the resist 13A is coated with a mixing-resistant agent, and is coated with the overhang mask definition resist 14A. Then, as shown in FIG. 11D, overhang formation areas 14B of the overhang definition resist 14A are exposed. Subsequently, the masks 13A and 14A are developed. This results in the plating mask 13 and the overhang mask 14, as shown in FIG. 11E. Then, the semiconductor substrate 11 is put in the plating chamber to grow the plating layers 15, as shown in FIG. 11F. During growth, the thicknesses of the plating layers 15 are controlled by the overhang mask 14, and the plating layers 15 is spaced apart from the mask 13 due to the function of the chamfer definition mask 20, so that the top portions of the layers 15 are chamfered. As shown in FIG. 11G, the masks 13, 20 and 14 are removed, and the power feed metal 12 is etched with the plating layers 15 used as mask.

As described above, according to the third embodiment of the present invention, it is possible to form plating layers of the same thickness independent of the opening sizes of the plating mask, the top portions of the plating layers being chamfered due to the gap between the mask 13 and the plating layers 15.

The plating layers grown according to any of the first through third embodiments of the present invention have the same hardness irrespective of the plating areas. The hardness of the plating layers may be measures by a Vickers/Knoop hardness measuring instrument. The Vickers hardness is the 136-degree diamond pyramid hardness test. The indenter produces a square indentation, and the diagonals thereof are measured by a microscope. The Vickers hardness is calculated by dividing the applied load by the surface area of the indentation. This measurement results in reliable numerals while the Brinell hardness test depends on the substance of the indenter. In addition, the indentation of the Vickers hardness is smaller than that of the Brinell hardness test.

The Vickers Hardness Hv (kg/mm$^2$) is defined as follows:

$$Hv=[\text{applied load }(kg)]/[\text{surface area of permanent indentation}]$$
$$\approx 1.8544 \times P/d^2$$

$$Hv=(2P \times \sin(\alpha/2))/d^2$$

Hv: Vickers hardness (kg/mm$^2$)

P: Applied load (kg)

d: average length of the diagonals of indentation (mm)

α: point angle (136 degree)

Usually, an applied load of 1 kg to 120 kg is used (preferably 5 kg to 50 kg). Besides, the micro hardness tester may be used to measure the hardness of the plating layers. The micro hardness tester is a compact version of the Vickers hardness tester and is used within the range of 5 g to 500 g.

The Knoop hardness tester uses a pyramidal diamond indenting tool of point angles 130 and 172.30 degrees. The long-to-short axis ratio of the resulting indentation is 7.11:1, and the Knoop hardness is calculated by measuring the long axis I as follows:

$$Hk=(14.230 \times P)/I^2$$

The measuring condition of the Knoop hardness test is almost the same as that of the Vickers test, and therefore, the values obtained by the Knoop test making a comparatively small indentation may be smaller than those by the Vickers test (the surface portion of metal is harder than the inner portion thereof).

Figure 12:
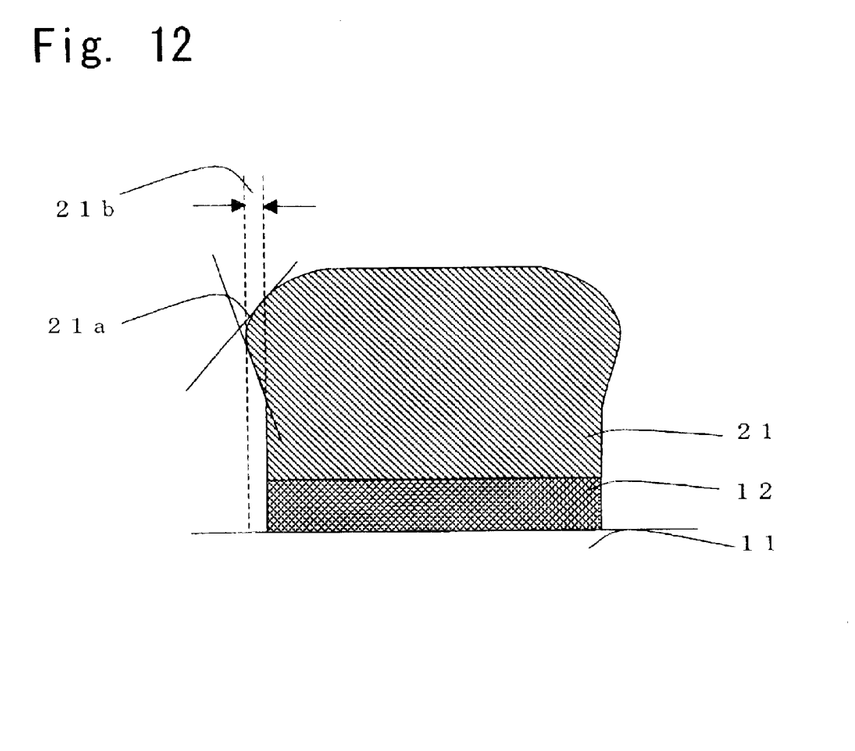
FIG. 12 is a cross-sectional view of a plating layer formed by the third embodiment of the present invention.

According to the third embodiment of the invention, the plating layers grow without contacting the resist 13. Therefore, as shown in FIG. 12, the plating layer has a portion 21a so that the width thereof is wider than the opening of the plating mask 20 by a length 21b. The portion 21a is chamfered and is wider than the lower portion of the plating layer. The portion 21a is a protrusion that extends laterally. The portion 21a has a width that continuously changes. The shape of the plating layer shown in FIG. 12 is quite unique. It can therefore be said that plating layers having a shape identical to or similar to the shape shown in FIG. 12 are formed according to the third embodiment of the present invention.

The present invention is not limited to the plate growth wiring lines or interconnections but includes bumps, lead electrodes, and spacers, which have unique advantages due to the use of the overhang definition mask.

According to the present invention, it is possible to arbitrarily control the growth rate of plating and form plating layers that have the same height but different top surface areas by performing plating only one time.

Finally, some of the aspects of the present invention are summarized as follows.

The method for fabricating a semiconductor device includes the steps of: (a) forming a mask on a predetermined layer, said mask having a first opening at a given side of the predetermined layer and a second opening that continues to and is smaller than the first opening; and (b) forming a plating layer on the predetermined layer by using the mask. In this case, the mask may include another first and second openings that continue to each other and has an even size. It is therefore possible to form, by performing plating only one time, plating layers that has different surface areas and an identical height. The term "identical" includes not only truly identical but also substantially identical. The latter may be introduced by, for example, error in the fabricating process.

The mask may include a plurality of first openings of different sizes and/or a plurality of second openings of different sizes. By setting the first and/or second openings to various sizes, it is possible to form plating layers having different surface areas and an identical height.

The above-mentioned step (a) may include the steps of forming a first mask having the first opening on the predetermined layer, and forming a second mask having the second opening on the first mask. The mask can be formed by two steps of the process.

The mask may include a third opening formed on the predetermined layer and continues to the first opening, the third opening being smaller than the first opening. Thus, the plating layer can be formed without contacting the mask during growth, this resulting in a chamfered top portion of the plating layer.

The second opening and the third opening may have an identical size. Thus, the initially rising portion of the plating layer is defined by the width of the second opening.

The method may be configured so that the step (a) includes the steps of: forming a first mask having a third opening on the predetermined layer, the third opening being smaller than the first opening; forming a second mask having the first opening on the first mask; and forming a third mask having the second opening on the second mask.

The method may also be configured so that the mask includes a plurality of second openings of different sizes, plating layers formed via the second openings having different widths and an identical height.

The method may also be configured so that the step (a) comprises the steps of forming a first mask having the first opening on the predetermined layer, and forming a second mask having the second opening on the first mask, the first and second masks having different sensitivities. It is therefore possible to etch the first and second masks without interference.

The method may also be configured so that the step (a) comprises the steps of forming a first mask having the first opening on the predetermined layer, and forming a second mask having the second opening on the first mask, the first and second masks comprising respective insulating layers different from each other. It is therefore possible to etch the first and second masks without interference.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method for fabricating a semiconductor device comprising the steps of:
   (a) forming a mask on a predetermined layer, said mask having a first opening at a given side of the predetermined layer and a second opening that continues to and is smaller than the first opening; and
   (b) forming a plating layer on the predetermined layer by using the mask.

2. The method according to claim 1, wherein the mask includes another first and second openings that continue to each other and has an even size.

3. The method according to claim 1, wherein the mask includes a plurality of first openings of different sizes and/or a plurality of second openings of different sizes.

4. The method according to claim 1, wherein the step (a) comprises the steps of forming a first mask having the first opening on the predetermined layer, and forming a second mask having the second opening on the first mask.

5. The method according to claim 1, wherein the mask includes a third opening formed on the predetermined layer and continues to the first opening, the third opening being smaller than the first opening.

6. The method according to claim 5, wherein the second opening and the third opening have an identical size.

7. The method according to claim 1, wherein the step (a) comprises the steps of:
   forming a first mask having a third opening on the predetermined layer, the third opening being smaller than the first opening;
   forming a second mask having the first opening on the first mask; and
   forming a third mask having the second opening on the second mask.

8. The method according to claim 1, wherein the mask includes a plurality of second openings of different sizes, plating layers formed via the second openings having different widths and an identical height.

9. The method according to claim 1, wherein the plating layer is a wiring line.

10. The method according to claim 1, wherein the plating layer is an electrode.

11. The method according to claim 1, wherein the step (a) comprises the steps of forming a first mask having the first opening on the predetermined layer, and forming a second mask having the second opening on the first mask, the first and second masks having different etch sensitivities.

12. The method according to claim 1, wherein the step (a) comprises the steps of forming a first mask having the first opening on the predetermined layer, and forming a second mask having the second opening on the first mask, the first and second masks comprising respective insulating layers different from each other.

13. The method according to claim 1, wherein the predetermined layer is an electrically conductive layer.

14. A method for fabricating a semiconductor device comprising the steps of:
   (a) forming a mask on a predetermined layer, said mask having an opening;
   (b) forming an overhang that covers part of the opening; and
   (c) forming plating layers on the predetermined layer by using the mask, a growth rate of one of the plating layers formed in said opening partially covered by said overhang being equal to that of another one of the plating layers formed in another opening.

15. A semiconductor device comprising plating layers formed on a predetermined layer,
   the plating layers having different widths, an identical height, and an identical hardness.

16. A semiconductor device comprising plating layers formed on a predetermined layer, one of the plating layers having a first portion that vertically extends with a constant width, and a second portion that continues to the first portion and is wider than the first portion.

17. The semiconductor device according to claim 16, wherein the width of the second portion continuously changes.

18. The semiconductor device according to claim 16, wherein the second portion has a portion having a width gradually increasing, and another portion having a width gradually decreasing.

19. The semiconductor device according to claim 16, wherein the second portion has a protrusion that extends laterally.

20. The semiconductor device according to claim 16, wherein the plating layers have an identical hardness.

21. The semiconductor device according to claim 16, wherein the plating layers have different widths and an identical height.

* * * * *